United States Patent
Lin et al.

(10) Patent No.: US 7,378,746 B2
(45) Date of Patent: May 27, 2008

(54) COMPOSITE BUMP

(75) Inventors: Ji-Cheng Lin, HsinChung (TW);
Yao-Sheng Lin, Chiayi (TW);
Shyh-Ming Chang, Hsinchu (TW);
Su-Tsai Lu, Tongluo Township, Miaoli County (TW); Hsien-Chie Cheng, Taichung (TW); Tai-Hong Chen, Sijhih (TW)

(73) Assignee: Industrial Technology Research Institute, Hsinchu (TW)

( * ) Notice: Subject to any disclaimer, the term of this patent is extended or adjusted under 35 U.S.C. 154(b) by 125 days.

(21) Appl. No.: 11/308,180

(22) Filed: Mar. 10, 2006

(65) Prior Publication Data
US 2007/0210457 A1    Sep. 13, 2007

(30) Foreign Application Priority Data
Dec. 29, 2005    (CN) ..................... 2005 1 0135282

(51) Int. Cl.
*H01L 23/48*    (2006.01)
*H01L 23/52*    (2006.01)
*H01L 29/40*    (2006.01)

(52) U.S. Cl. ....................... 257/780; 257/781

(58) Field of Classification Search ................ 257/780, 257/781, 783
See application file for complete search history.

(56) References Cited

U.S. PATENT DOCUMENTS

| | | | |
|---|---|---|---|
| 5,508,228 A * | 4/1996 | Nolan et al. ............... 438/614 |
| 5,877,556 A | 3/1999 | Jeng et al. .................. 257/737 |
| 6,084,301 A * | 7/2000 | Chang et al. ............... 257/737 |
| 6,337,445 B1 * | 1/2002 | Abbott et al. .............. 174/260 |
| 2006/0110678 A1 * | 5/2006 | Dueber et al. ........... 430/270.1 |

* cited by examiner

*Primary Examiner*—S. V. Clark
(74) *Attorney, Agent, or Firm*—Jianq Chyun IP Office

(57) ABSTRACT

A composite bump suitable for disposing on a substrate pad is provided. The composite bump includes a compliant body and an outer conductive layer. The coefficient of thermal expansion (CTE) of the compliant body is between 5 ppm/° C. and 200 ppm/° C. The outer conductive layer covers the compliant body and is electrically connected to the pad. The compliant body can provide a stress buffering effect for a bonding operation. Furthermore, by setting of the CTE of the compliant body within a preferable range, damages caused by thermal stress are reduced while the bonding effect is enhanced.

17 Claims, 16 Drawing Sheets

| | range | contact stress | warp quantity |
|---|---|---|---|
| Young's modulus | 0.1~20 GPa | ← | → |
| coefficient of thermal expansion | 5~200 (ppm/°C) | → | → |

FIG. 6

COMPOSITE BUMP

BACKGROUND OF THE INVENTION

1. Field of the Invention

The present invention relates to a bonding structure between electronic device packages. More particularly, the present invention relates to a bump structure that can provide good bonding properties.

2. Description of the Related Art

In the fabrication of high-density electronic packages, a means of enhancing the bonding effect between an integrated circuit device and a carrier substrate, thereby increasing the production yield, is always an important research topic.

Using liquid crystal display (LCD) as an example, the technique for packaging an LCD has changed from chip-on-board (COB) to tape-automated-bonding (TAB) and then to the current fine pitch chip-on-glass (COG) due to the need for higher image resolution and the demand for a lighter and slimmer electronic product.

However, in most conventional packaging process that uses bumps as a means of bonding, the difference in the coefficient of thermal expansion (CTE) between the chip and the carrier substrate is quite significant. Therefore, after the chip and the carrier substrate are bonded together, warpage often occurs due to CTE mismatch between the chip, the bumps and the carrier substrate. As a result, the bumps are thermally stressed. Moreover, with the ever-increasing level of integration of the integrated circuit, the effects resulting from the thermal stress and the warpage are increasingly significant. One of the major effects includes a drop in the reliability of connection between the chip and the carrier substrate and the subsequent failure to comply with the reliability test.

K. Hatada in U.S. Pat. No. 4,749,120 proposed using gold bumps to serve as an electrical connection between a chip and a substrate, and in the meantime, using resin as a bonding agent between the two. However, the Young's modulus of metal is substantially higher than resin. Hence, in the process of joining the chip and the carrier substrate together and curing the resin, considerable contact stress must be applied. In addition, the gold bumps will be subjected to considerable peeling stress after the bonding process so that the gold bumps may peel off from the chip or the carrier substrate.

In another method, Y. Tagusa et. al in U.S. Pat. No. 4,963,002 proposed using nickel-plated (nickel) beads or silver particles to achieve electrical connection. Yet, this method is only suitable for bonding a small area. Furthermore, if the silver particles are used in the bonding process, the large Young's modulus of silver may lead to the same bump-peeling problem.

In yet another method, Sokolovsky et. al in U.S. Pat. No. 4,916,523 proposed using a unidirectional conductive bonding agent to bond the chip and the carrier substrate together. On the other hand, Brady et. al in U.S. Pat. No. 5,134,460 also proposed a design that involves coating a metallic layer over conductive metal bumps.

SUMMARY OF THE INVENTION

Accordingly, at least one objective of the present invention is to provide a method of minimizing the thermal stress problem in an electronic package due to a coefficient of thermal expansion (CTE) mismatch.

At least another objective of the present invention is to provide a method of resolving bump bonding problem due to Young's modulus problem so that the production yield is increased.

To achieve these and other advantages and in accordance with the purpose of the invention, as embodied and broadly described herein, the invention provides a composite bump suitable for disposing on the pad of a substrate. The composite bump includes a compliant body and an outer conductive layer. The coefficient of thermal expansion (CTE) of the compliant body is between 5 ppm/° C. and 200 ppm/° C. The outer conductive layer covers the compliant body and is electrically connected to the pad.

In one embodiment of the present invention, the Young's modulus of the compliant body is between 0.1 GPA to 2.8 Gpa, or between 3.5 Gpa to 20 Gpa, for example.

In one embodiment of the present invention, the compliant body is fabricated using polymer material. For example, the compliant body can be fabricated using polyimide or epoxy-based polymer.

In one embodiment of the present invention, the composite bump may further include a solder layer disposed on the outer conductive layer, for example. The solder layer is fabricated using lead-tin alloy, for example.

In one embodiment of the present invention, the compliant body can have the shape of a block and is disposed on the pad. The surface of the compliant body away from the pad can be a flat surface, a roughened surface or a curve surface.

In one embodiment of the present invention, the compliant body may include a plurality of protruding objects, for example. All the protruding objects can be disposed on the pad or on the peripheral region of the pad. However, a portion of the protruding objects may be disposed on the pad while the remaining protruding objects may be disposed on the peripheral region of the pad.

In one embodiment of the present invention, the compliant body may further include a substrate conductive layer disposed between the compliant body and the substrate. Furthermore, the outer conductive layer is connected to the substrate conductive layer. The compliant body has a block shape and extends to an area outside the pad. In addition, the surface of the compliant body away from the pad can be a flat surface, a roughened surface or a curve surface and the substrate conductive layer can be fabricated using a metal, for example.

Accordingly, the compliant body inside the composite bump in the present invention can provide a buffering effect during the bonding process. Furthermore, the coefficient of thermal expansion (CTE) of the compliant body can be adjusted to match the Young's modulus through design. As a result, the thermal stress is reduced and bonding effect is enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 6 is a table analyzing the material parameters (including the coefficient of thermal expansion and the Young's modulus) of an integrated compliant body on the bonding effect.

DESCRIPTION OF THE PREFERRED EMBODIMENTS

Figure 1A:
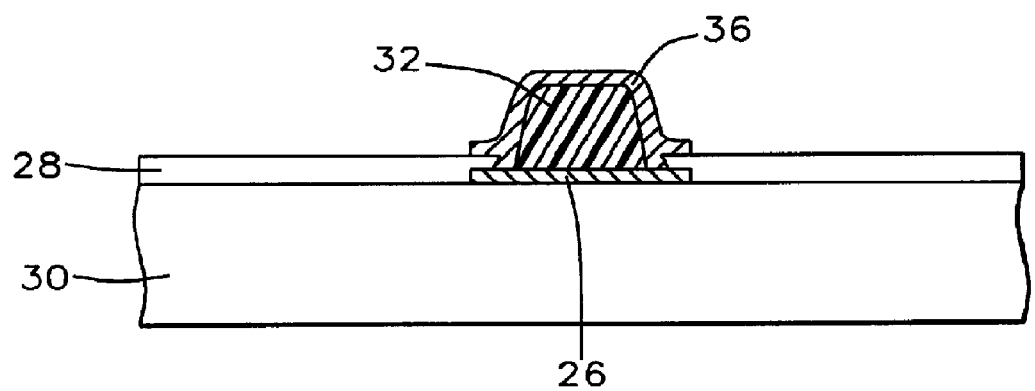
FIGS. 1A and 1B are schematic cross-sectional views showing a composite bump disposed on a substrate according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The composite bump disclosed in the present invention can be disposed on a chip or any suitably designed carrier substrate such as a circuit board or a flexible tape. In the following embodiments, the generic name 'substrate' is used throughout and identical components are labeled with the same numbers.

Figure 1B:
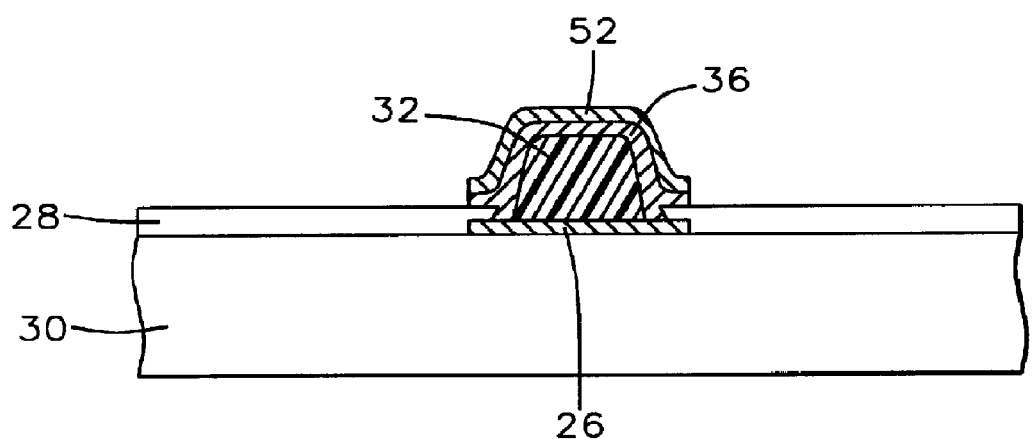

FIGS. 1A and 1B are schematic cross-sectional views showing a composite bump disposed on a substrate according to one preferred embodiment of the present invention. The substrate 30 in FIGS. 1A and 1B has a pad 26 and a protective layer 28 thereon. The pad 26 has a diameter of about 90 μm, for example. The compliant body 32 is disposed on the pad 26. The compliant body 32 has a thickness between about 5 μm to 25 μm. In the present embodiment, the compliant body 32 is fabricated using polymer material such as polyimide or epoxy-based polymer material, for example. Obviously, in other embodiments of the present invention, other materials having similar properties can be used to fabricate the compliant body 32.

In addition, an outer conductive layer 36 covers the compliant body 32. The outer conductive layer 36 can be fabricated using a metallic material such as aluminum or nickel, or an alloy such as nickel/gold, chromium/gold, chromium/silver or titanium/platinum. Obviously, the outer conductive layer 36 can also be an adhesion/barrier/conductor composite layer such as a chromium/copper/gold, chromium/nickel/gold, chromium/silver/gold, titanium/platinum/gold, titanium/palladium/gold or titanium/tungsten/silver composite layer. As shown in FIG. 1B, if solder bonding is required, then the outer conductive layer 36 may further include a solder layer 52 such as a lead-tin (PbSn), an indium-gallium (InGa) or an indium-tin (InSn) solder layer.

Figure 2:
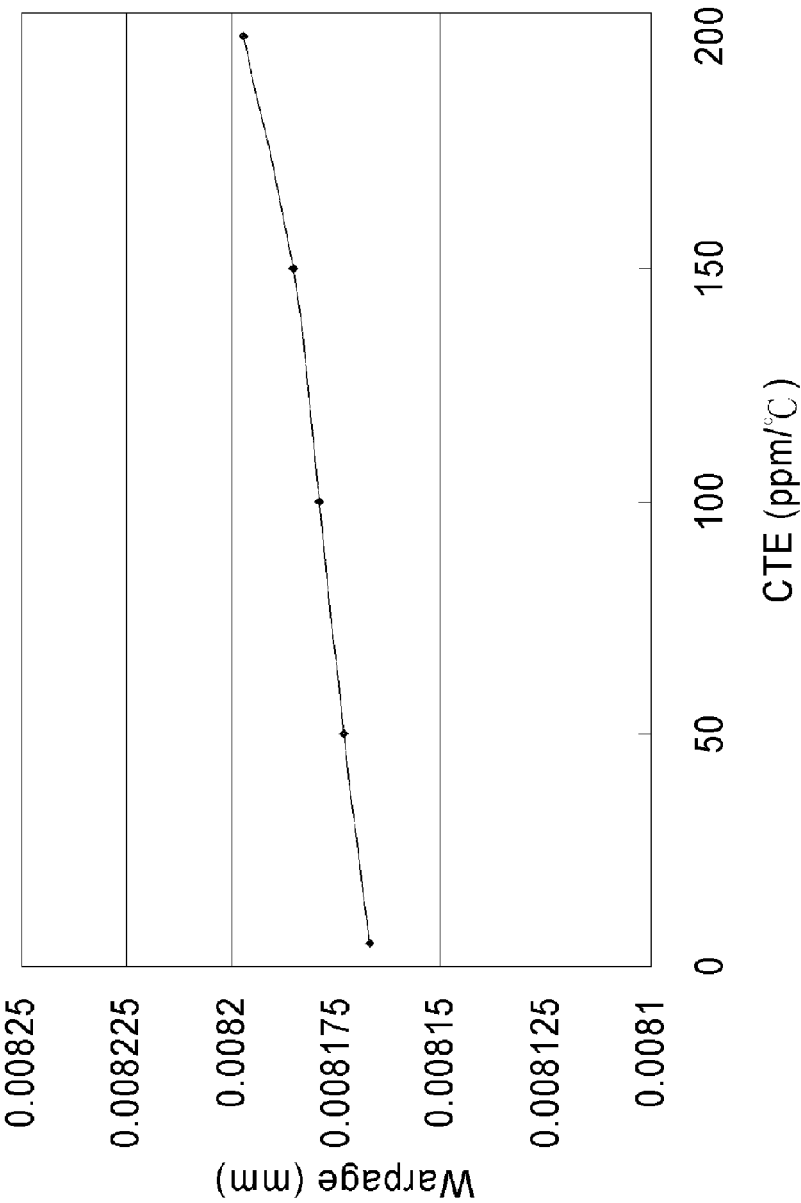
FIG. 2 is a graph showing the relation between the warpage and the coefficient of thermal expansion of a compliant body.
Figure 3:
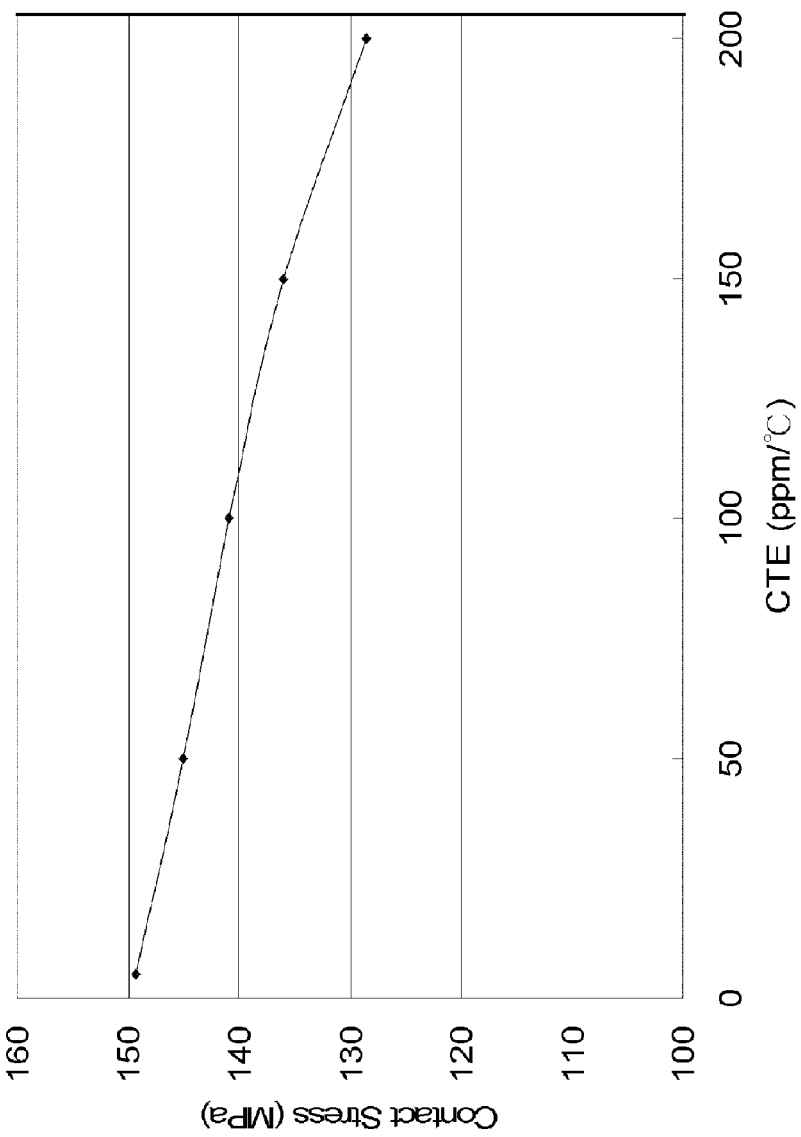
FIG. 3 is a graph showing the relation between the contact stress and the coefficient of thermal expansion of a compliant body.

To avoid the thermal stress resulting from a coefficient of thermal expansion (CTE) mismatch, the CTE of the compliant body 32 is specially designed. FIG. 2 is a graph showing the relation between the warpage and the coefficient of thermal expansion of the compliant body 32. FIG. 3 is a graph showing the relation between the contact stress and the coefficient of thermal expansion of the compliant body 32. As shown in FIGS. 2 and 3, if a lower degree of warpage is required or a higher contact stress is demanded to enhance the bonding strength, the compliant body 32 has to be fabricated using a material having a smaller CTE. Thus, based on the aforementioned analysis, the CTE of the compliant body 32 in the present invention is set within a preferable range of between 5 ppm/° C. and 200 ppm/° C. to produce the optimum effect. In fact, the preferred range for the CTE should be between 10 ppm/° C. and 150 ppm/° C.

Figure 4:
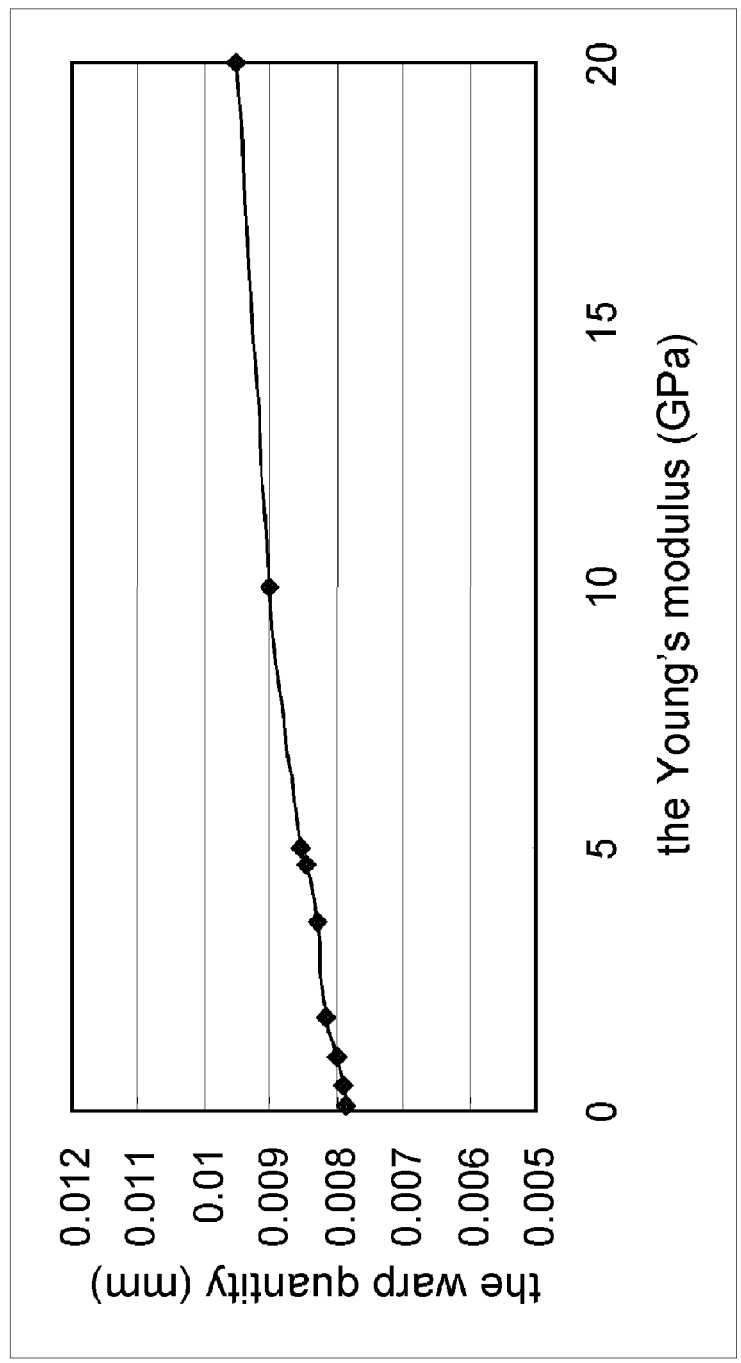
FIG. 4 is a graph showing the relation between the warpage and the Young's modulus of a compliant body.
Figure 5:
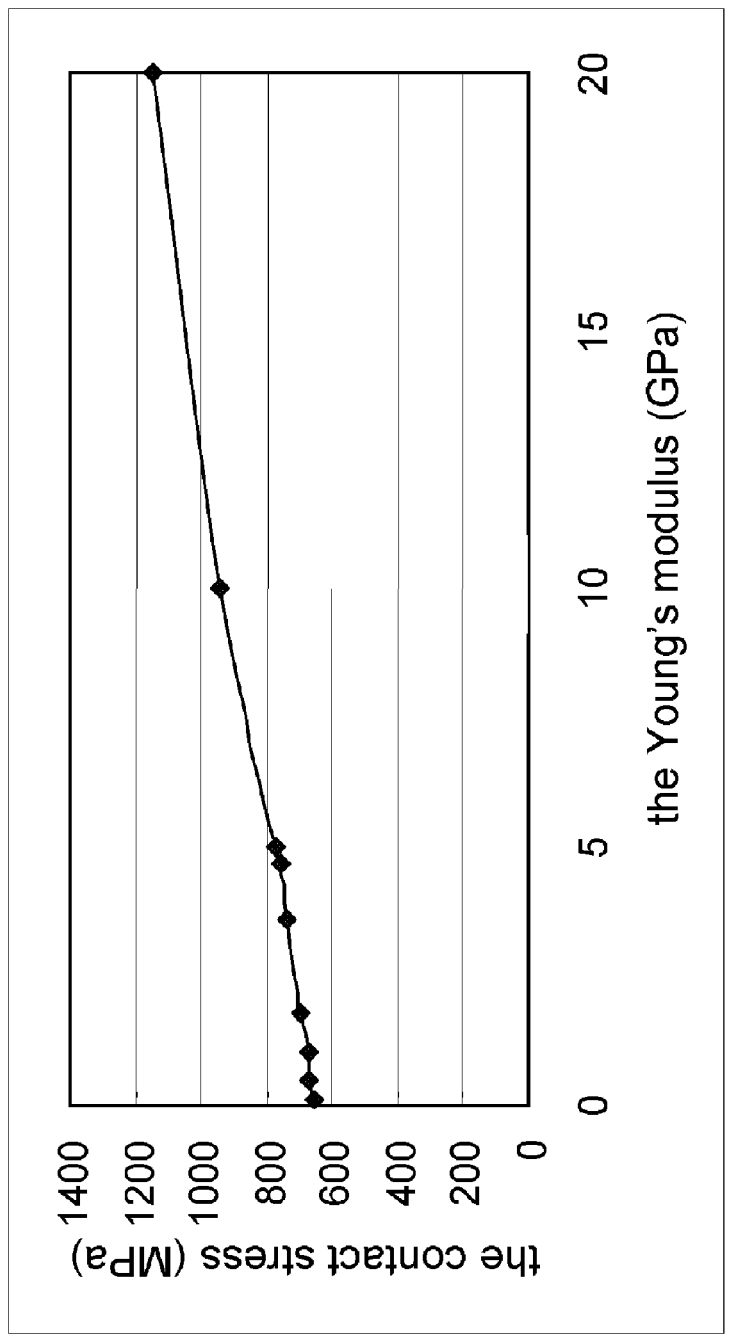
FIG. 5 is a graph showing the relation between the contact stress and the Young's modulus of a compliant body.

In addition, the Young's modulus of the compliant body 32 also has some effect on the bonding effect. Hence, the Young's modulus of the compliant body 32 can be selected to increase the bonding effect and achieve an optimal design. FIG. 4 is a graph showing the relation between the warpage and the Young's modulus of the compliant body 32. FIG. 5 is a graph showing the relation between the contact stress and the Young's modulus of the compliant body 32. As observed from FIGS. 4 and 5, if the amount of warpage needs to be minimized, the compliant body 32 should be fabricated using a material having a small Young's modulus. If the contact stress needs to be higher, the compliant body 32 should be fabricated using a material having a larger Young's modulus.

FIG. 6 is a table analyzing the material parameters (including the coefficient of thermal expansion and the Young's modulus) of the compliant body 32 on the bonding effect. With the aforementioned selection of the CTE in the preferred range and due consideration regarding the effect of the Young's modulus of the compliant body 32 on the bonding effect, the Young's modulus of the compliant body 32 is between 0.1 GPa and 2.8 GPa or between 3.5 GPa and 20 GPa. If the Young's modulus of the compliant body 32 is chosen to be between 0.1 GPa and 2.8 GPa, the warpage is lowered although the contact stress is smaller. On the other hand, if the Young's modulus of the compliant body 32 is chosen to be between 3.5 GPa and 20 GPa, the contact stress is increased to enhance bonding strength. Therefore, the present invention permits an amendment for the contact stress through a proper selection of the Young's modulus for the compliant body 32.

Figure 7:
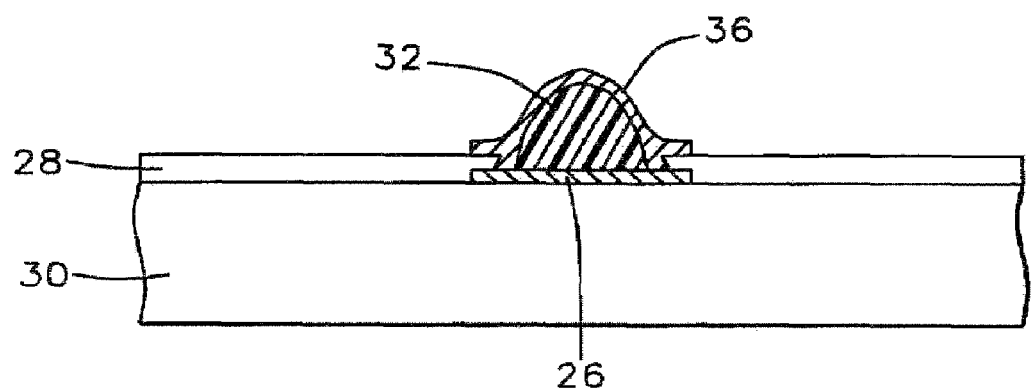
FIG. 7 is a schematic cross-sectional view of a hemispherical bump according to the present invention.
Figure 8:
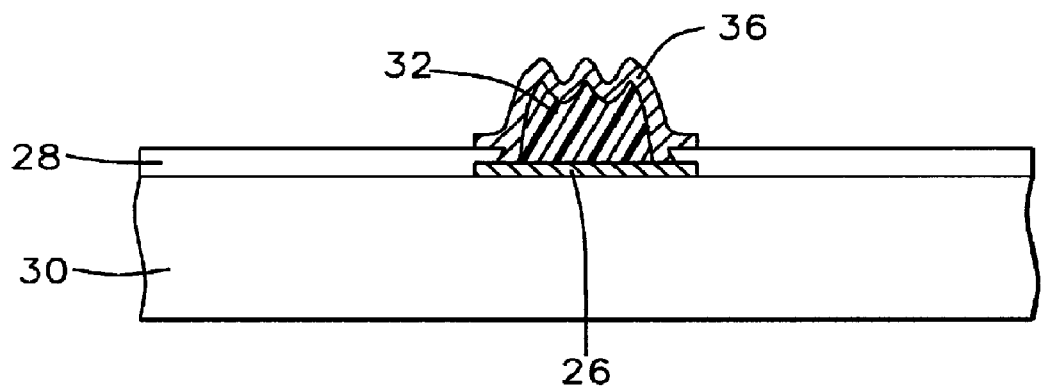
FIG. 8 is a schematic cross-sectional view of a composite bump with a roughened surface according to the present invention.

Beside the composite bump shown in FIGS. 1A and 1B, the present invention also provide other composite bumps having different shapes and dispositions. FIG. 7 is a schematic cross-sectional view of a hemispherical bump according to the present invention. The surface of the compliant body 32 away from the pad 26 is a curve surface, for example. FIG. 8 is a schematic cross-sectional view of a composite bump with a roughened surface according to the present invention. The surface of the compliant body 32 away from the pad 26 has a roughened surface, for example.

Figure 9:
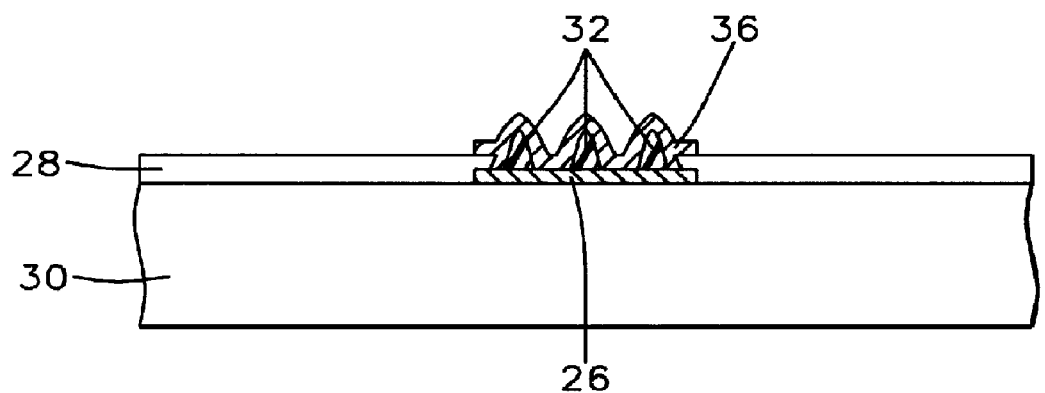
FIGS. 9 through 11 are schematic cross-sectional views showing a composite bump with different types of protrusion arrangements.
Figure 10:
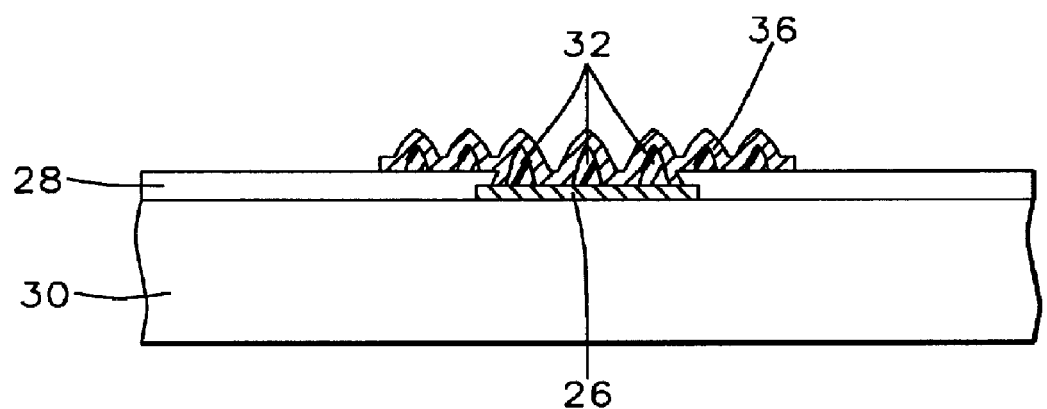
Figure 11:
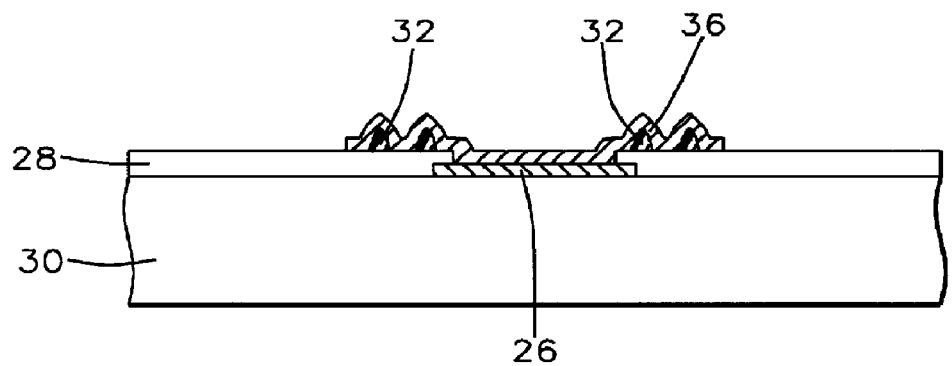

FIG. 9 is schematic cross-sectional view of a composite bump having a plurality of protrusions thereon. The compliant body 32 comprises a plurality of protrusions and the protrusions are disposed on the pad 26. Similarly, FIGS. 10 and 11 are schematic cross-sectional views showing a composite bump with a plurality of protrusions. The protrusions in FIG. 10 are disposed on both the pads 26 and the peripheral region of the pad 26, but the protrusions in FIG. 11 are disposed on the peripheral region of the pad 26 only.

Figure 12A:
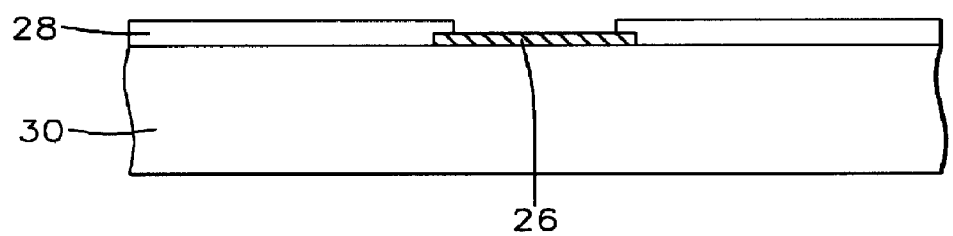
FIGS. 12A through 12I are schematic cross-sectional views showing the steps for fabricating a composite bump according to the present invention.

FIGS. 12A through 12I are schematic cross-sectional views showing the steps for fabricating a composite bump according to the present invention. First, as shown in FIG. 12A, a substrate 30 having a pad 26 and a protective layer 28 thereon is provided. The pad 26 has a diameter of about 90 µm, for example. Furthermore, the surface of the pad 26 has been etched and cleaned.

Figure 12B:
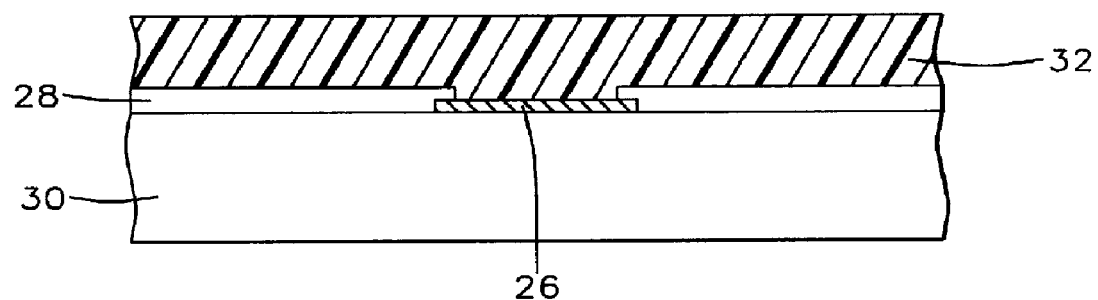

As shown in FIG. 12B, a compliant material layer 32 is formed over the substrate 30. The compliant material layer 32 is fabricated using the aforementioned polymer material, for example. In the present embodiment, the compliant material layer 32 is a non-photosensitive material such as non-photosensitive polyimide or epoxy-based polymer material having a thickness between about 5~25 µm.

Figure 12C:
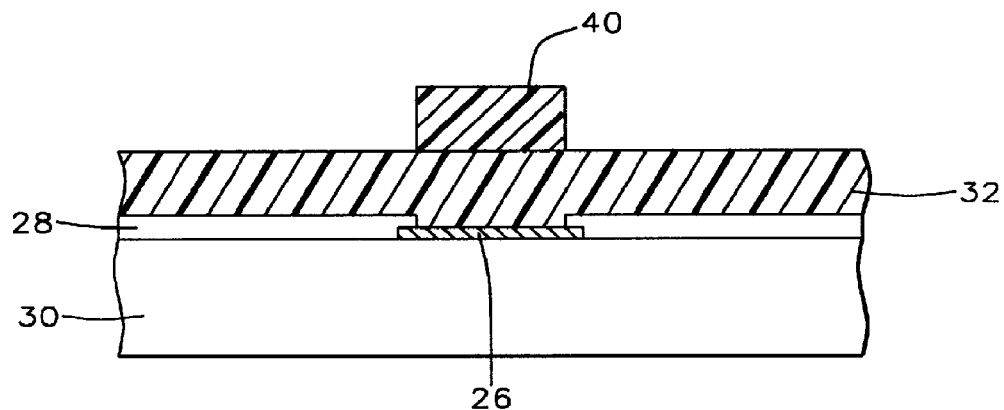
Figure 12D:
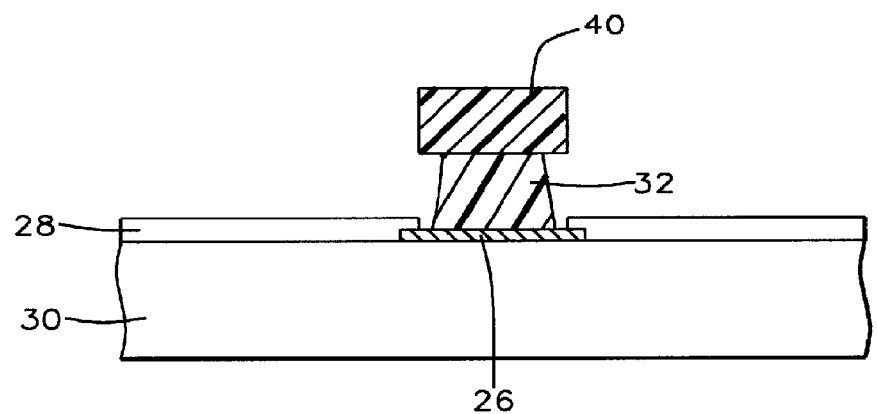

As shown in FIG. 12C, a patterned photoresist layer 40 is formed over the compliant material layer 32 above the pad 26. As shown in FIG. 12D, using the photoresist layer 40 as a mask, the compliant material layer 32 is etched to form a compliant body 32. The process of etching the compliant material layer 32 to form the compliant body 32 is more thoroughly described in chapter 8 of the book "Polyimides" written by Wilson, Stenzenberger and Hergenrother.

Figure 12E:
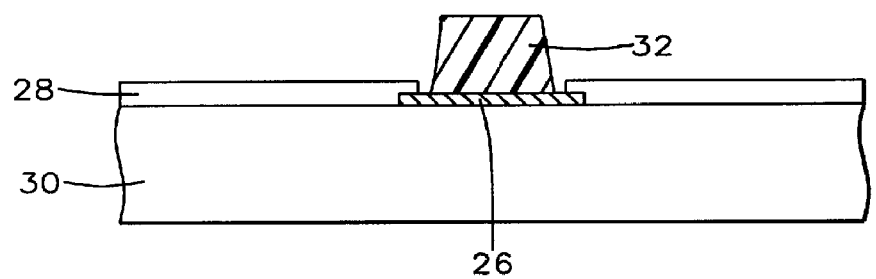
Figure 12F:
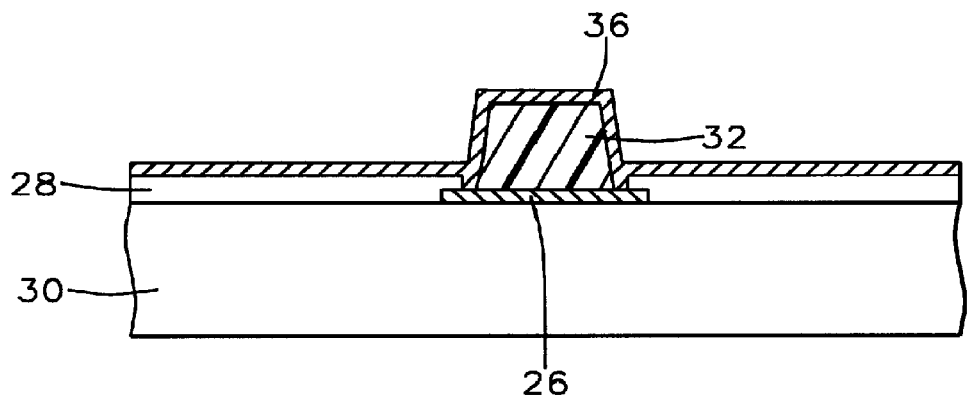

As shown in FIG. 12E, the photoresist layer 40 is removed. As shown in FIG. 12F, an outer conductive material layer 36 is formed globally over the substrate 30. The outer conductive material layer 36 is, for example, a chromium/gold alloy layer comprising a chromium layer with a thickness of about 500 Å and a gold layer with a thickness of about 2000 Å. The outer conductive material layer 36 can also be a single metal layer of aluminum or nickel, or an alloyed layer of nickel/gold, chromium/silver or titanium/platinum. Furthermore, the outer conductive layer material 36 can also be an adhesion/barrier/conductive composite layer including, for example, chromium/copper/gold, chromium/nickel/gold, chromium/silver/gold, titanium/platinum/gold, titanium/palladium/gold or titanium/tungsten/silver.

Figure 12G:
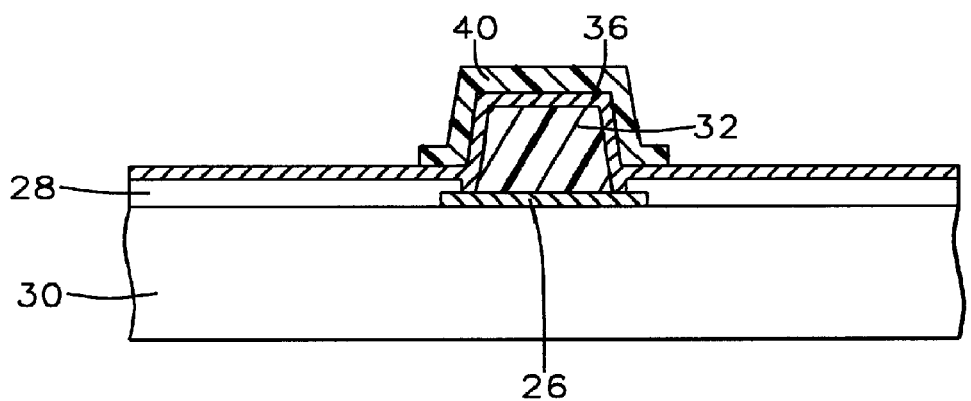
Figure 12H:
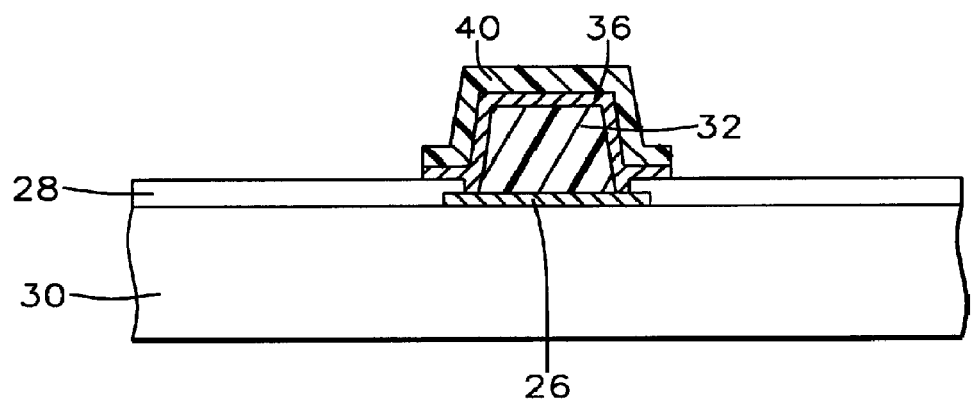
Figure 12I:
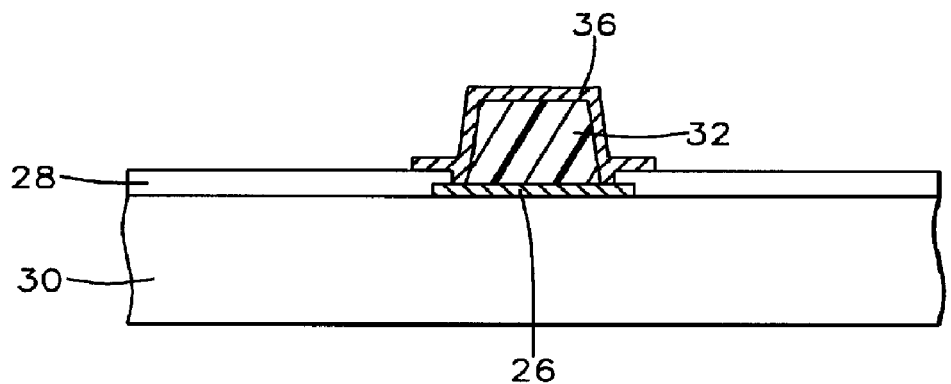

As shown in FIG. 12G, another patterned photoresist layer 40 is formed over the outer conductive material layer 36. As shown in FIG. 12H, using the photoresist layer 40 as a mask, the outer conductive material layer 36 is etched to form an outer conductive layer 36. Thereafter, as shown in FIG. 12I, the photoresist layer 40 is removed to produce a composite bump.

Figure 13A:
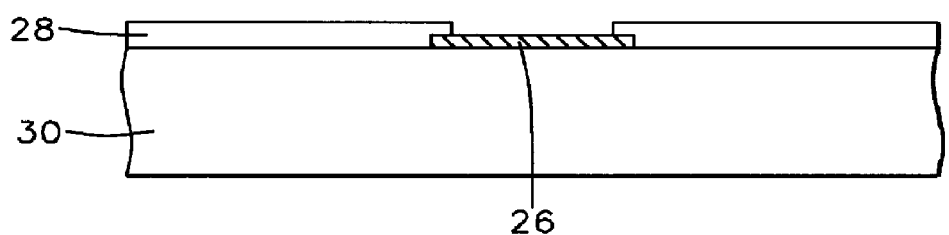
FIGS. 13A through 13J are schematic cross-sectional views showing the steps for fabricating a composite bump with a substrate conductive layer according to the present invention.
Figure 13B:
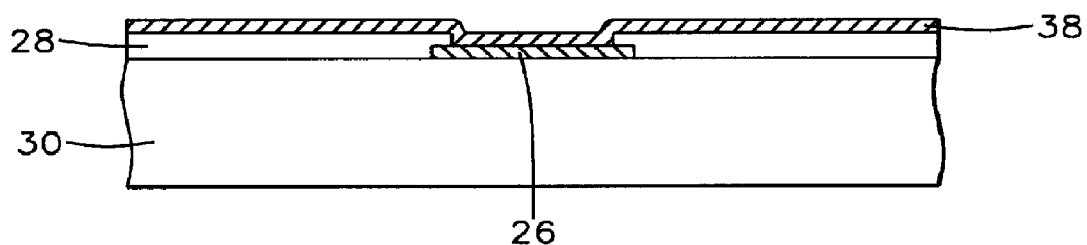
Figure 13C:
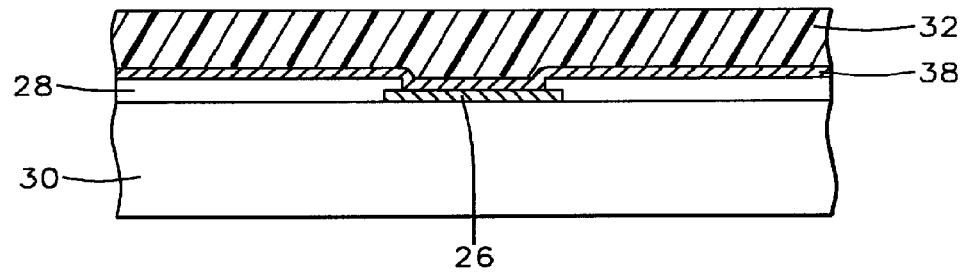
Figure 13D:
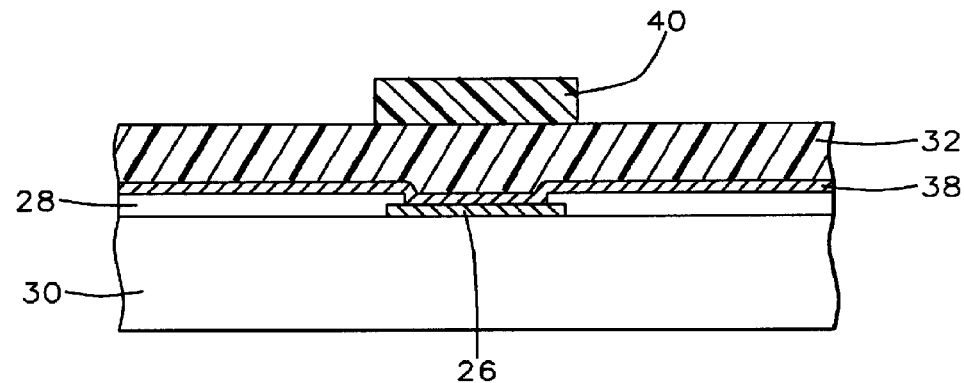
Figure 13E:
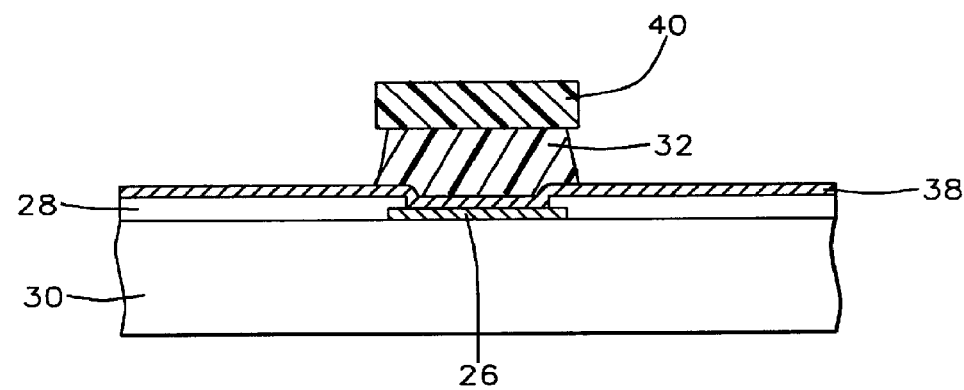
Figure 13F:
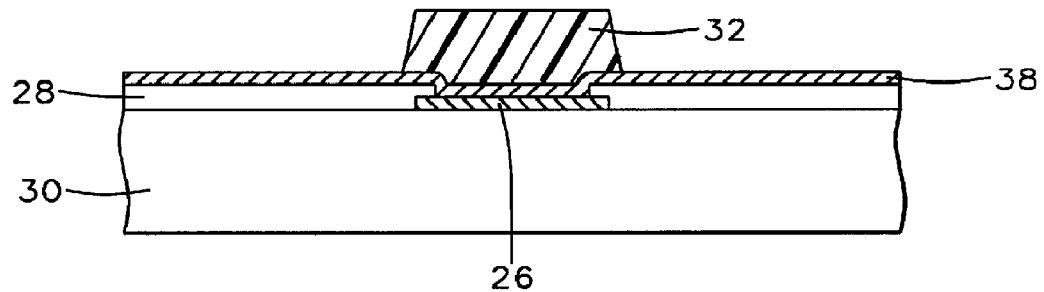
Figure 13G:
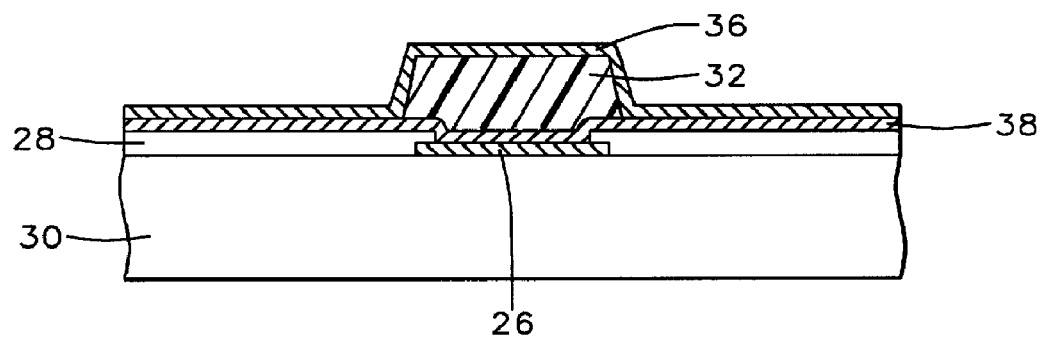
Figure 13H:
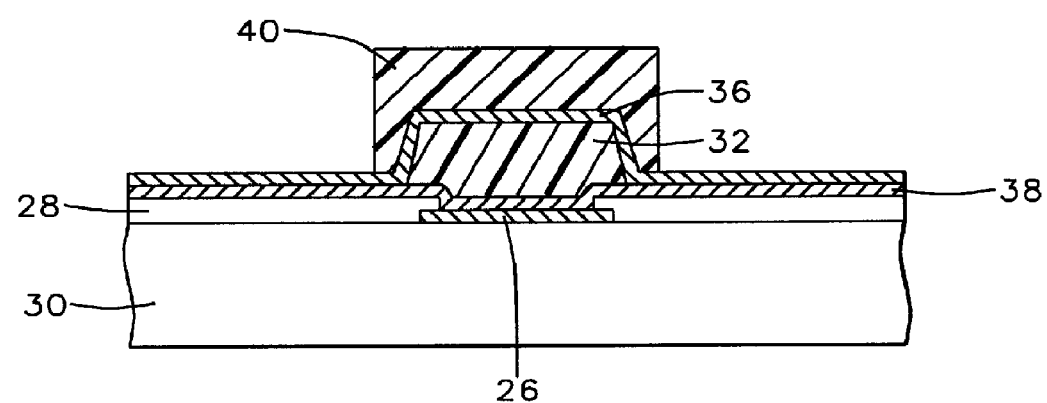
Figure 13I:
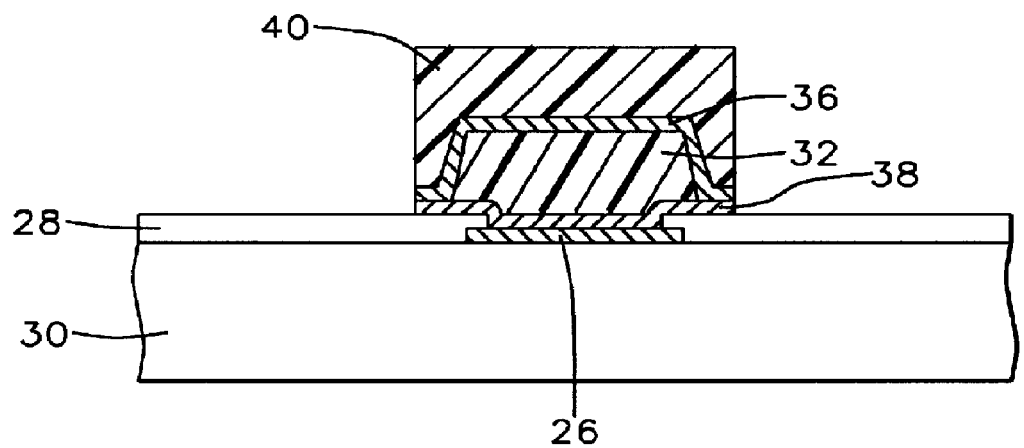
Figure 13J:
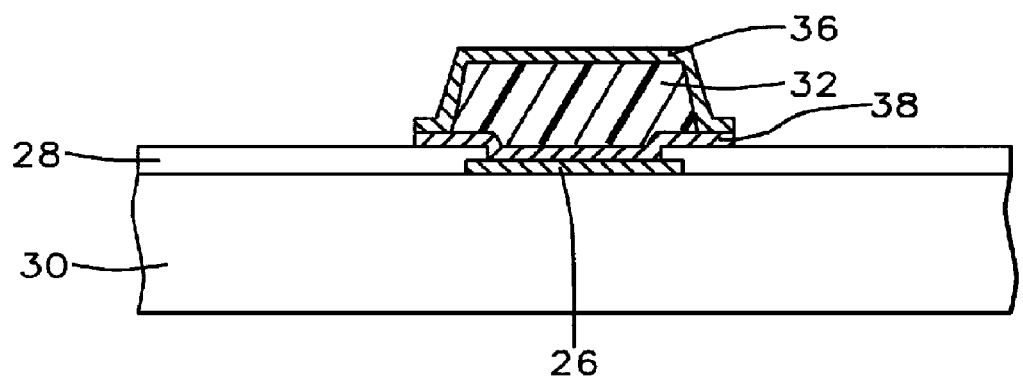

The composite bump in the aforementioned embodiment can further include a substrate conductive layer 38 (as shown in FIG. 13J) disposed between the compliant body 32 and the substrate 30 and extended into the peripheral area of the pad 26 above the protective layer 28. Therefore, the compliant body 32 is able to extend outside the pad 26 and the outer conductive layer 36 covering the compliant body 32 connects with the substrate conductive layer 38. The substrate conductive layer 38 is fabricated using aluminum, for example.

FIGS. 13A through 13J are schematic cross-sectional views showing the steps for fabricating a composite bump with the substrate conductive layer 38 according to the present invention. In the figures, a detailed explanation of previously described components (for example, material, thickness or processing parameters) is omitted in the following, and refers to the previous embodiment when necessary. First, as shown in FIG. 13A, a substrate 30 having a pad 26 and a protective layer 28 thereon is provided. As shown in FIG. 13B, a substrate conductive layer 38 is formed over the substrate 30. The substrate conductive layer 38 is fabricated using a metallic material including aluminum or other suitable conductive material, for example. Then, as shown in FIGS. 13C~13I, the steps necessary for fabricating the compliant body 32 and the outer conductive layer 36 as in the previous embodiment are carried out. In the process of etching the conductive material layer 36 as in FIGS. 13H and 13I, the substrate conductive material layer 38 is also etched. After removing the photoresist layer 40, a composite bump like the one shown in FIG. 13J is formed.

The foregoing embodiment disclosed a method that uses non-photosensitive material to fabricate the compliant body. Obviously, the present invention also permits the use of photosensitive material in the fabrication of the compliant body. Since most of the steps have been described in detail in the previous embodiments, a detailed description is not repeated here.

Figure 14:
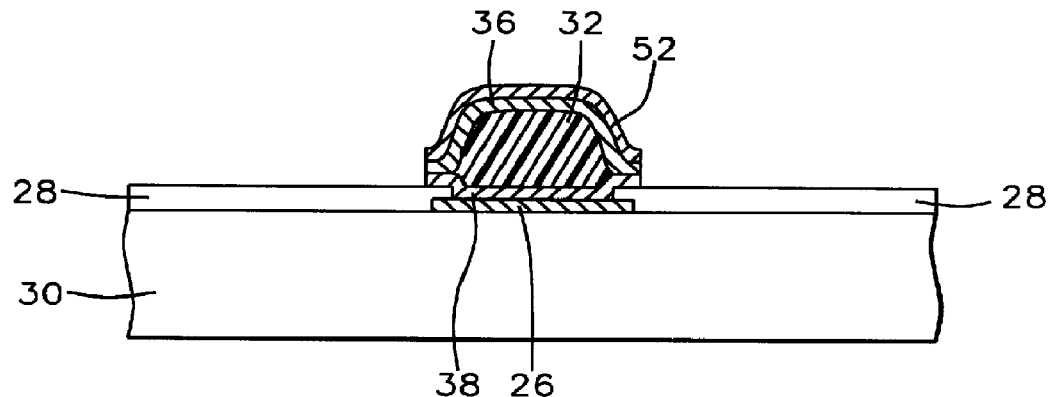
FIGS. 14 through 16 are schematic cross-sectional views showing other composite bumps with a substrate conductive layer according to the present invention.
Figure 15:
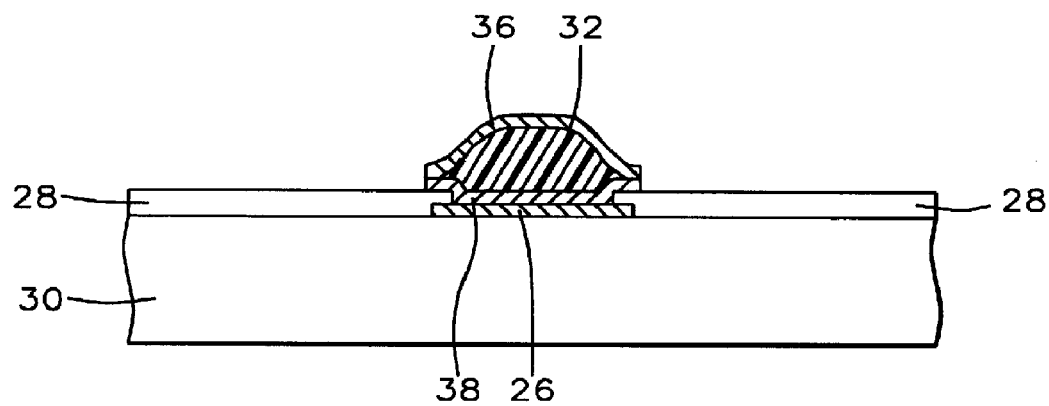
Figure 16:
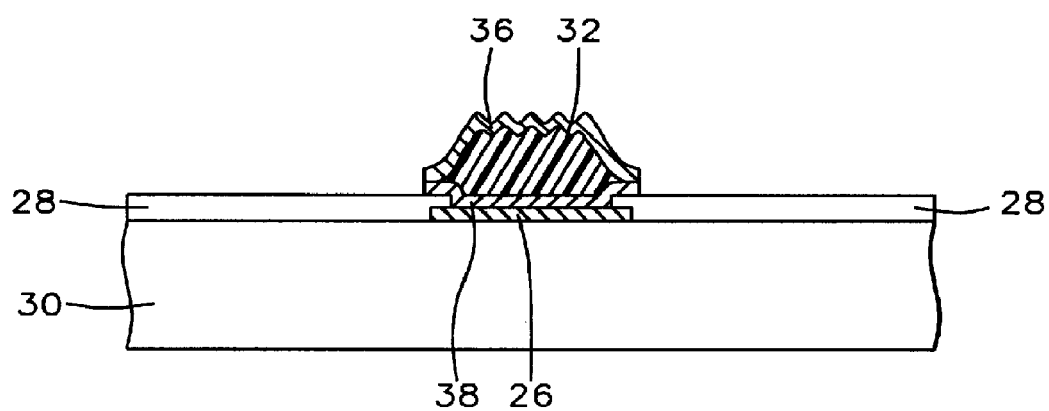

In the following, several other types of composite bumps with substrate conductive layer fabricated according to the present invention are also illustrated as shown in FIGS. 14 through 16. In FIG. 14, a composite bump having a solder layer 52 formed over the outer conductive pad layer 36 is shown. In FIG. 15, the surface of the compliant body away from pad 26 is a curve surface. In FIG. 16, the surface of the compliant body away from the pad 26 is a roughened surface. Since the material, thickness and method of fabrication of the components in the present embodiments are closely related to the aforementioned embodiments, a detailed description is omitted.

In summary, the composite bump in the present invention mainly has a compliant body for providing a stress buffering effect. Furthermore, because the coefficient of thermal expansion of the compliant body is chosen to be within a preferred range, thermal stress is significantly relieved to increase the bonding effect. In addition, the Young's modulus of the compliant body can be specially designed to strike a balance between the contact stress and its corresponding peeling stress. Thus, a higher production yield can be obtained. Moreover, the present invention also permits a modification of the shape and disposition of the composite bump to produce an optimum design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A composite bump suitable for disposing over a pad on a substrate, the composite bump comprising:

a compliant body, wherein the coefficient of thermal expansion (CTE) of the compliant body is between 5 ppm/° C. and 200° C., and the Young's modulus of the compliant body is between 0.1 GPa and 2.8 GPa or between 3.5 GPa and 20 GPa; and an outer conductive layer covering the compliant body and electrically connecting with the pad.

2. The composite bump of claim 1, wherein the material constituting the compliant body includes a polymer material.

3. The composite bump of claim 2, wherein the material constituting the compliant body includes polyimide.

4. The composite bump of claim 2, wherein the material constituting the compliant body includes epoxy-based polymer.

5. The composite bump of claim 1, wherein the bump further includes a solder layer disposed over the outer conductive layer.

6. The composite bump of claim 5, wherein the material constituting the solder layer includes a lead-tin soldering material.

7. The composite bump of claim 1, wherein the compliant body has the shape of a block and is disposed on the pad.

8. The composite bump of claim 7, wherein the compliant body has a roughened surface away from the pad.

9. The composite bump of claim 7, wherein the compliant body has a curve surface away from the pad.

10. The composite bump of claim 1, wherein the compliant body comprises a plurality of protrusions.

11. The composite bump of claim 10, wherein the protrusions are disposed on the pad or the peripheral region of the pad.

12. The composite bump of claim 10, wherein portion of the protrusions are disposed on the pad and the remaining portion of the protrusions are disposed on the peripheral region of the pad.

13. The composite bump of claim 1, wherein the bump further includes a substrate conductive layer disposed between the compliant body and the substrate such that the outer conductive layer is connected to the substrate conductive layer.

14. The composite bump of claim 13, wherein the compliant body has the shape of a block and extends into the area outside the pad.

15. The composite bump of claim 14, wherein the compliant body has a roughened surface away from the pad.

16. The composite bump of claim 14, wherein the compliant body has a curve surface away from the pad.

17. The composite bump of claim 13, wherein the material constituting the substate conductive layer includes a metal.

* * * * *